United States Patent
Ghadiri Sadrabadi et al.

(10) Patent No.: US 12,308,531 B2
(45) Date of Patent: May 20, 2025

(54) GAIN VARIATION COMPENSATION USING TEMPERATURE ATTENUATOR

(71) Applicant: Renesas Electronics America Inc., Milpitas, CA (US)

(72) Inventors: Mohammad Ghadiri Sadrabadi, San Diego, CA (US); Tumay Kanar, Carlsbad, CA (US)

(73) Assignee: Renesas Electronics America Inc., Milpitas, CA (US)

(*) Notice: Subject to any disclaimer, the term of this patent is extended or adjusted under 35 U.S.C. 154(b) by 720 days.

(21) Appl. No.: 17/345,107

(22) Filed: Jun. 11, 2021

(65) Prior Publication Data
US 2022/0399642 A1 Dec. 15, 2022

(51) Int. Cl.
*H01Q 3/36* (2006.01)
*G05F 3/16* (2006.01)
*H01P 1/22* (2006.01)
*H03H 7/25* (2006.01)

(52) U.S. Cl.
CPC ............... *H01Q 3/36* (2013.01); *G05F 3/16* (2013.01); *H01P 1/22* (2013.01); *H03H 7/253* (2013.01)

(58) Field of Classification Search
CPC .......... H01Q 3/267; H01Q 3/36; H01Q 3/26; H01Q 3/28; H01Q 3/2605; H01P 1/22–23; H03H 7/24–256; H03H 11/24–245
USPC ..................................................... 342/372
See application file for complete search history.

(56) References Cited

U.S. PATENT DOCUMENTS

| | | | | |
|---|---|---|---|---|
| 3,568,073 A | * | 3/1971 | McGuffin | H03G 1/0052 327/306 |
| 3,652,959 A | * | 3/1972 | Denny | H03H 7/255 333/81 R |
| 3,775,708 A | * | 11/1973 | Sly | H03H 7/255 333/81 A |
| 4,236,126 A | * | 11/1980 | Weller | H03H 7/255 333/81 R |
| 4,646,036 A | * | 2/1987 | Brown | H03H 11/24 330/284 |
| 5,093,667 A | * | 3/1992 | Andricos | H03F 1/0244 342/368 |
| 6,297,709 B1 | * | 10/2001 | Wey | H03H 11/24 455/249.1 |
| 6,667,669 B2 | * | 12/2003 | Goyette | H03G 1/0058 327/306 |
| 6,973,288 B1 | * | 12/2005 | Davis | H03G 1/0052 455/67.11 |
| 2008/0088392 A1 | * | 4/2008 | Yamamoto | H03H 11/24 333/81 R |
| 2019/0312330 A1 | * | 10/2019 | Madsen | H01Q 3/2605 |

* cited by examiner

*Primary Examiner* — Cassi J Galt
(74) *Attorney, Agent, or Firm* — SCULLY, SCOTT, MURPHY & PRESSER, P.C.

(57) ABSTRACT

Methods and apparatuses for signal attenuation is described. In an example, an attenuator can be configured to perform attenuation of signals for an integrated circuit. The attenuator can vary the attenuation with an ambient temperature. The attenuator can further adjust the attenuation based on a control signal applied to the attenuator. The control signal can be based on one or more of a temperature profile of the attenuator and a target gain variation of the integrated circuit.

20 Claims, 8 Drawing Sheets

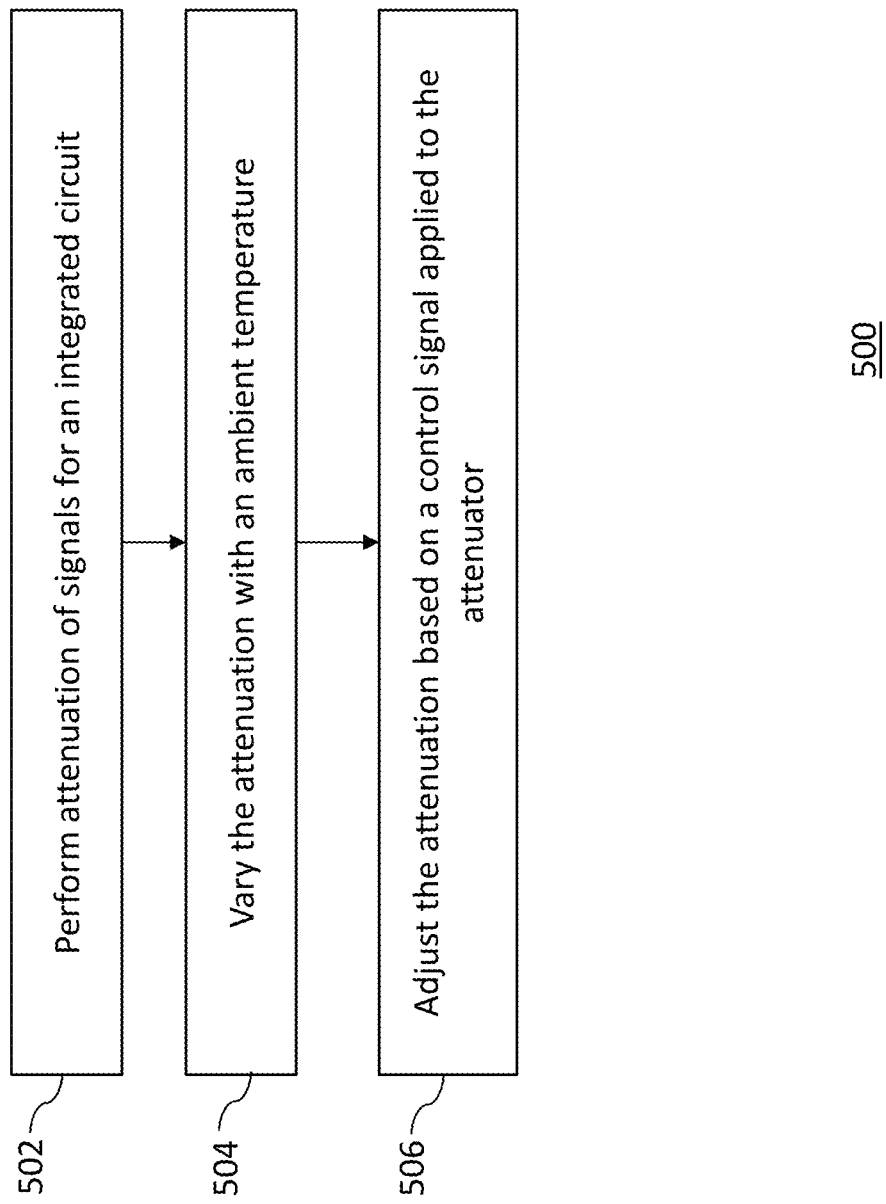

GAIN VARIATION COMPENSATION USING TEMPERATURE ATTENUATOR

BACKGROUND

The present disclosure relates in general to methods and apparatus for controlling gain variation using an attenuator. In particular the attenuator can be a programmable temperature variable attenuator that controls loss over temperature variation.

Performance of computer chips or integrated circuits can vary according to temperature variation, such as changes in ambient temperature. In an example, a gain of a beamformer device or chip can vary as its ambient temperature changes. Particularly, the gain can decrease as the ambient temperature increases, where the decreased gain can be caused by component (e.g., transistor) parameters that change over temperature variation. The gain variation with changes in ambient temperature can cause the integrated circuit to operate under unpredictable and unstable conditions.

SUMMARY

In some examples, an apparatus for signal attenuation is generally described. The apparatus can include an attenuator. The attenuator can be configured to perform attenuation of signals for an integrated circuit. The attenuator can be further configured to vary the attenuation with an ambient temperature. The attenuator can be configured to adjust the attenuation based on a control signal applied to the attenuator.

In some examples, a method for signal attenuation is generally described. The method can include performing, by an attenuator, attenuation of signals for an integrated circuit. The method can further include varying, by the attenuator, the attenuation with an ambient temperature. The method can further include adjusting, by the attenuator, the attenuation based on a control signal applied to the attenuator.

In some examples, an apparatus for controlling an attenuator configured to perform attenuation of signals for an integrated circuit, and for varying the attenuation with an ambient temperature, is generally described. The apparatus can include a controller. The controller can be configured to receive a target gain variation of the integrated circuit. The controller can be further configured to determine a gain variation of the integrated circuit. The controller can be further configured to generate a control signal to adjust the attenuation applied to the integrated circuit in order to adjust the determined gain variation to match the target gain variation.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 5 is a flow diagram illustrating a process of implementing gain variation compensation using temperature attenuator in one embodiment.

DETAILED DESCRIPTION

The gain variation of an integrated circuit, such as a beamformer, as temperature increases, can cause instability in a performance of the beamformer. Various biasing schemes can be used to address the gain variation of a beamformer chip in response to temperature changes. For example, temperature models can be used for increasing an amount of current to the beamformer to increase the gain at higher ambient temperatures. However, these temperature models can be unreliable because they cannot completely predict the performance of the chip, and the resulting gain variation can be significantly different from the simulated result. Further, increasing the current at higher temperatures to boost the gain can result in significant power consumption.

Figure 1:
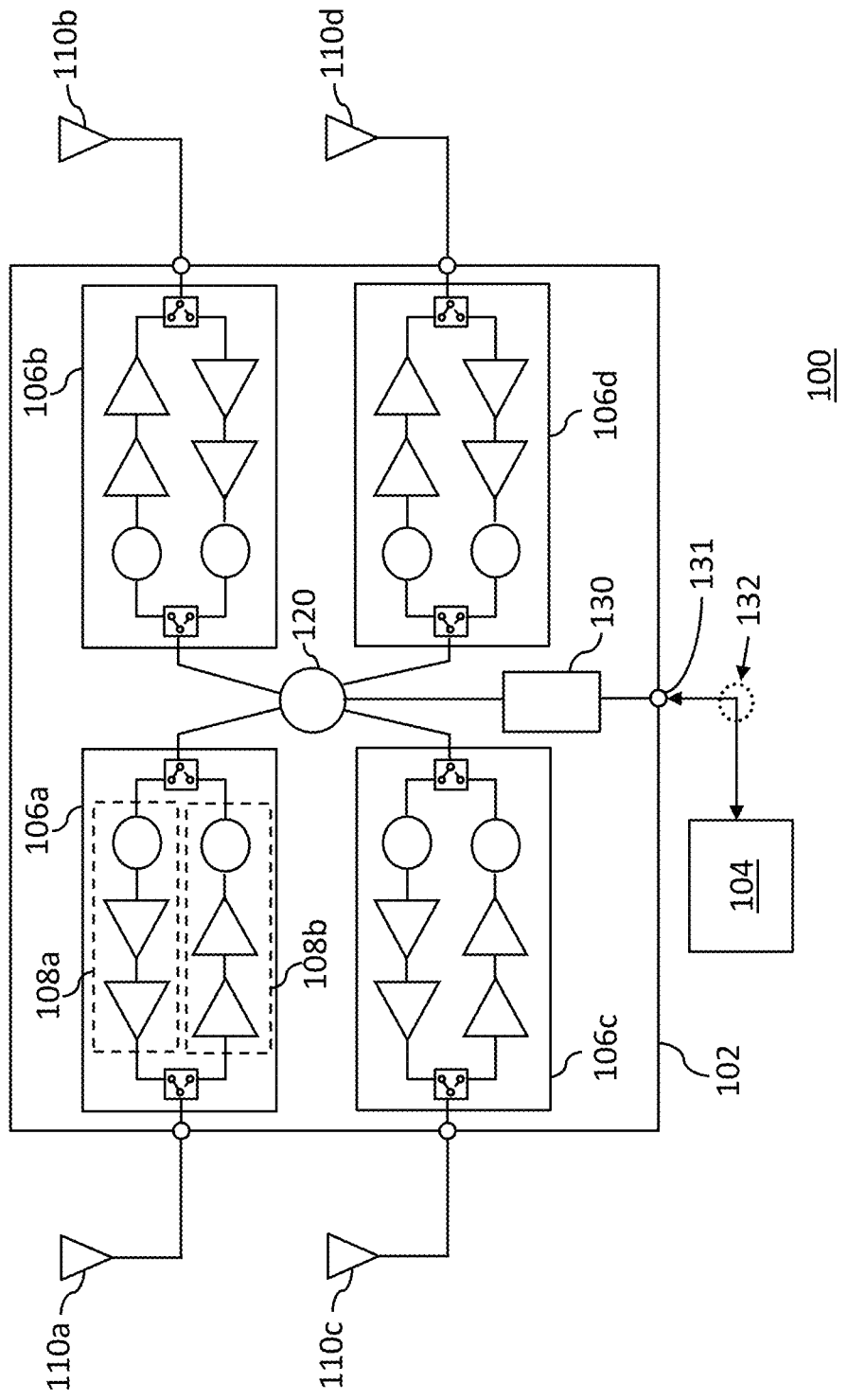
FIG. 1 is a diagram showing an example system that can implement gain variation compensation using temperature attenuator in one embodiment.

FIG. 1 is a diagram showing an example system 100 that can implement a gain variation compensation using a temperature attenuator in one embodiment. The system 100 can be a radio frequency (RF) transmission system implemented by a communication device, such as a RF transmitter or a RF transceiver. The system 100 can be configured to operate at common wireless radio frequencies, millimeter-wave frequencies, and/or microwave frequencies. The system 100 can be a part of a wireless communication network, such as fourth generation (4G) wireless communications system, fifth generation (5G) wireless communications system, satellite communication system, point-to-point communications systems such as common data link, and/or other types of wireless communication networks.

The system 100 can include a beamformer chip (or "beamformer") 102, a circuit 104, a plurality of antennas 110a, 110b, 110c, 110d, and an attenuator 130. The circuit 104 can be a part of a RF communication device such as a RF transmitter or a RF transceiver. For example, the circuit 104 can include a baseband processor, mixer circuits such as up-down converters, filters, memory devices, local oscillators, digital-to-analog converters (DAC), analog-to-digital converters (ADC), signal generators, microcontrollers, and/or other types of components or integrated circuits that belong to a RF communication device. The circuit 104 can be configured to output RF signals to the beamformer 102. In examples where the circuit 104 is part of a RF transceiver, the circuit 104 can be configured to receive RF signals from the beamformer 102. The RF signals being exchanged between the circuit 104 and the beamformer 102 can be radio-frequency, millimeter-wave frequency, or microwave frequency signals that can carry information or data.

The beamformer 102 can include a plurality of transmission channels or transceiver channels. In the example shown in FIG. 1, the beamformer 102 can include a plurality of channels 106a, 106b, 106c, 106d, where the plurality of channels 106a, 106b, 106c, 106d can be transceiver channels. Each channel among the plurality of channels 106a, 106b, 106c, 106d can include a transmission channel and a receiver channel. Using the channel 106a as an example, the channel 106a can include a transmission channel 108a and a receiver channel 108b. The plurality of channels 106a, 106b, 106c, 106d can be connected to the plurality of antennas 110a, 110b, 110c, 110d, respectively. Although four channels are shown in the example of FIG. 1, it will be apparent to a person of ordinary skill in the art that the beamformer 102 can include an arbitrary number of channels. Each channel among the plurality of channels 106a, 106b, 106c, 106d can include components such as control circuit, power amplifiers, gain control circuits, phase shifters or phase control circuits, and/or other types of components or integrated circuits that can facilitate execution of beamforming techniques.

In examples where the circuit 104 is part of a RF transmitter or a RF transceiver, each channel among the plurality of channels 106a, 106b, 106c, 106d can receive a copy of a RF signal transmitted from the circuit 104 to the beamformer 102. The plurality of channels 106a, 106b, 106c, 106d can receive its copy of the RF signal via a common point, such as a node 120. In examples where the plurality of channels 106a, 106b, 106c, 106d are transmission channels, the node 120 can be a common connection point in a communication bus of the beamformer 102. The plurality of channels 106a, 106b, 106c, 106d can generate beamforming signals having respective phase and gain. The plurality of channels 106a, 106b, 106c, 106d can transmit the generated beamforming signals to the plurality of antennas 110a, 110b, 110c, 110d, respectively.

The plurality of antennas 110a, 110b, 110c, 110d can form a phased array antenna configured to output the generated beamforming signals to form a beam. The beam can broadcast the information or data being carried by the RF signal provided by the circuit 104. The beam generated by the antennas 110a, 110b, 110c, 110d can have a field pattern and direction that can be based on the parameters (e.g., gain and phase) set by the plurality of channels 106a, 106b, 106c, 106d. For example, the plurality of antennas 110a, 110b, 110c, 110d can output respective beamforming signals at different times based on the phase set by the plurality of channels 106a, 106b, 106c, 106d. The different output times of the beamforming signals, and the different gain of the beamforming signals, can form the field pattern and direction of the beam generated by the antennas 110a, 110b, 110c, 110d. In an example, the beam can also be steered by the system 100 based on different combinations of phases set by the plurality of channels 106a, 106b, 106c, 106d.

Further, each antenna among the plurality of antennas 110a, 110b, 110c, 110d can also receive a beam carrying information or data. The plurality of antennas 110a, 110b, 110c, 110d can provide respective RF signals to the plurality of channels 106a, 106b, 106c, 106d, respectively. Each one of the plurality of channels 106a, 106b, 106c, 106d can decode its own received RF signal and the decoded signals can be combined at a common connection point, such as a summation node or a combiner circuit. In examples where the plurality of channels 106a, 106b, 106c, 106d are transceiver channels, the node 120 can be the summation node or the combiner circuit. The combiner circuit can be configured to combine signals from the plurality of channels 116a, 116b, 116c, 116d into a RF signal that can be transmitted to the circuit 104.

The attenuator 130 can be integrated in the beamformer 102 to perform attenuation of signals associated with operations of the beamformer 102. For example, the attenuator 130 can attenuate signals being transmitted from the beamformer 102 to the plurality of antennas 110a, 110b, 110c, 110d, and signals being received by the beamformer 102 from the circuit 104 and/or the plurality of antennas 110a, 110b, 110c, 110d, or other signals being exchanged within the beamformer 102. The attenuator 130 can be, for example, a programmable temperature variable attenuator that can be configurable or programmable by a variable control voltage or current. The attenuation performed by the attenuator 130 can vary inversely with an ambient temperature of the system 100, and this varying attenuation can be further refined or adjusted by the variable control voltage or current. Depending on circuit component arrangements and configuration in the attenuator 130, the attenuation being performed by the attenuator 130 can 1) vary proportionally with the variable control voltage or current, or 2) vary inversely with the variable control voltage or current.

In an example, a performance of the beamformer 102 can be measured by one or more gain parameters. These gain parameters can include, for example, forward voltage gain, reverse voltage gain, and/or other gain parameter relating to input ports and/or output ports of the channels in the beamformer 102. The attenuation being performed by the attenuator 130 can be controlled based on temperature dependency of its components, such as diodes within the attenuator 130. For example, a level of attenuation being performed by the attenuator 130 can be programmable by biasing the components (e.g., diodes) of the attenuator 130 to different levels in accordance with the components' temperature profiles. By using a variable control voltage or current to further refine or adjust the attenuation being performed by the attenuator 130, the attenuation can be increased at lower ambient temperatures in order to reduce or suppress a gain of the beamformer 102 at the lower ambient temperatures. As the ambient temperature increases, the attenuation being performed by the attenuator 130 can be adjusted in order to obtain a controlled gain variation of the beamformer 102. Thus, if a specific targeted gain variation (e.g., minimal gain variation) is desirable, the attenuator 130 can be configured or programmed by the variable control voltage or current to attenuate signals in the beamformer 102, under a controlled manner, to obtain the targeted gain variation. Further, by increasing attenuation at lower temperatures, it may not be necessary to increase the gain of the beamformer 102 at higher temperatures, thus, the power consumption by the beamformer 102 to increase the gain at high temperatures can be avoided.

Further, the attenuator 130 can be located at a common connection point among the plurality of channels of the beamformer 102 (e.g., channels 116a, 116b, 116c, 116d) such that the attenuator 130 can apply a same amount of loss or attenuation to each one of the plurality of channels. For example, in the example shown in FIG. 1, the attenuator 130 can be connected between the node 120 and a port 131 of the beamformer 102, where the port 131 can connect the beamformer 102 to the circuit 104. Another possible location of the attenuator 130 can be a location 132 between the port 131 and the circuit 104. By integrating the attenuator 130 at a common connection point among the plurality of channels, attenuator 130 can apply the same amount of attenuation to all channels without a need to integrate a copy of the attenuator 130 in each one of the channels, thus preserving circuit board space. Also, in some examples, the beamformer 102 can include multiple copies of the attenuator 130 integrated at different locations within the system 100 to apply different amount of loss to different parts of the system 100 in order to achieve a desired gain variation. In another example, different copies of the attenuator 130 can be located within different channels of the beamformer 102.

Figure 2A:
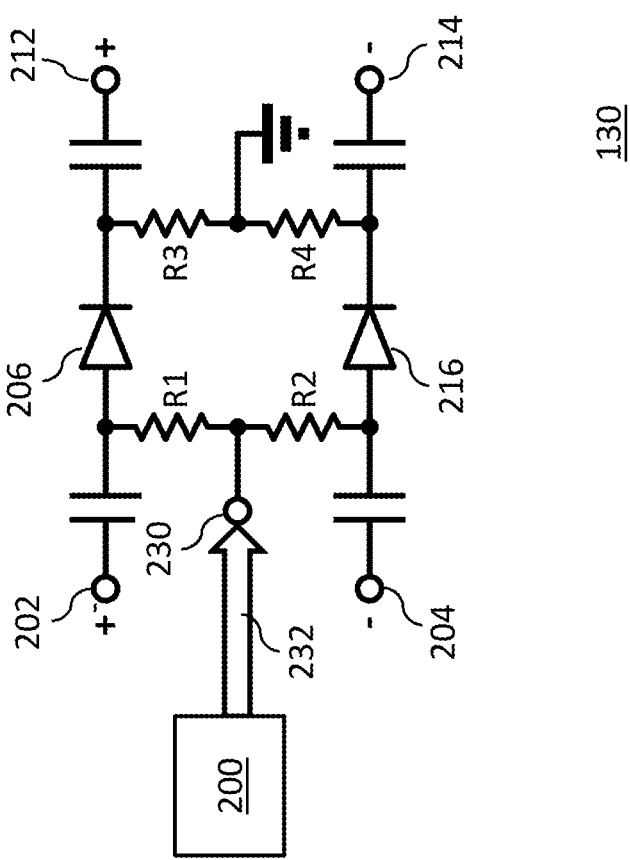
FIG. 2A is a diagram showing an example of a programmable temperature variable attenuator in one embodiment.
Figure 2B:
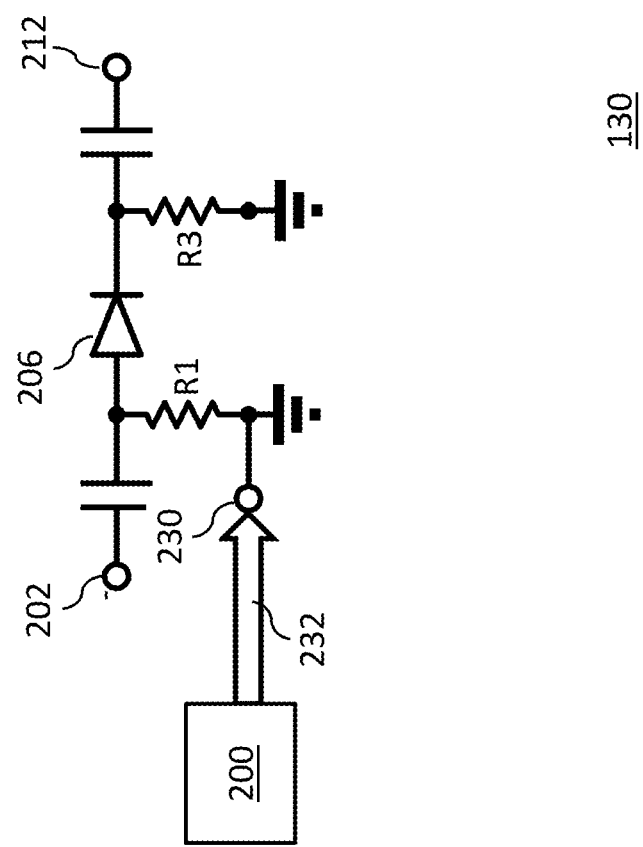
FIG. 2B is a diagram showing another example of a programmable temperature variable attenuator in one embodiment.

FIG. 2A is a diagram showing an example of a programmable temperature variable attenuator in one embodiment. In an example shown in FIG. 2A, the attenuator 130 can include terminals or pins 202, 204, 212, and 214. The pins 202, 204, 212, and 214 can be input/output (I/O) terminals or pins of the attenuator 130. In the example shown in FIG. 2A, the attenuator 130 can be a balanced attenuator implementing differential signaling for connections using a pair of conductors (e.g., a pair of wires, a pair of twisted wires, etc.). The pins 202 and 212 can be positive terminals forming a positive channel of the attenuator 130 and the pins 204 and 214 can be negative terminals forming a negative channel of the attenuator 130. In another example shown in FIG. 2B, the attenuator 130 can also be an unbalanced attenuator implementing single-wire signaling for connections using single-wire transmission lines. It will be apparent to a person of ordinary skill in the art that the examples shown in FIG. 2A and FIG. 2B can function similarly, and the descriptions herein pertaining to FIG. 2A can be applicable to FIG. 2B, and vice versa.

In the example shown in FIG. 2A, the pins 202, 204, 212, and 214 can be connected to different parts or components of the system 100 shown in FIG. 1. In the example shown in FIG. 1, the pins 202 and 204 of the attenuator 130 can be connected to the port 131 of the beamformer 102, and the pins 212 and 214 of the attenuator 130 can be connected to the node 120 in the beamformer 102. In another example, the pins 202 and 204 of the attenuator 130 can be connected to the node 120 of the beamformer 102, and the pins 212 and 214 of the attenuator 130 can be connected to the port 131 in the beamformer 102. In another example, if the attenuator 130 is located at the location 132, the pins 202 and 204 of the attenuator 130 can be connected to the circuit 104, and the pins 212 and 214 of the attenuator 130 can be connected to the port 131 of the beamformer 102. Further, in some examples, if the attenuator 130 is located at the location 132, the pins 202 and 204 of the attenuator 130 can be connected to the port 131 of the beamformer 102, and the pins 212 and 214 of the attenuator 130 can be connected to the circuit 104. The attenuator 130 can be implemented in both a transmitting direction and a receiving direction. For example, connections between the attenuator 130 and the beamformer, or between the attenuator 130 and the circuit 104, can be switched between a transmission mode and a receiving mode such that the attenuator 130 can perform attenuation for signals being transmitted and received by the beamformer 102.

The attenuator 130 can include a diode 206 and a diode 216. In an example, the diodes 206 and 216 can be PIN diodes (e.g., a diode with a wide, undoped intrinsic semiconductor region between a p-type semiconductor and an n-type semiconductor region). It will be apparent to a person of ordinary skill in the art that the diodes 206 and 216 can be any type of diodes, depending on designs, configurations, and/or implementations of the beamformer 102. The diodes 206 and 216 can be connected in series along current paths or channels of the attenuator 130. For example, the diode 206 can be connected in series with the pins 202 and 212 along the positive channel of the attenuator 130, and the diode 216 can be connected in series with the pins 204 and 214 along the negative channel of the attenuator 130. The diode 206 and the diode 216 can be connected to one another in a parallel connection, where one or more resistors R1, R2, R3, R4 can be connected between the diode 206 and the diode 216 to facilitate impedance matching and biasing of the diodes 206 and 216.

In an example, when a diode is forward biased, the diode can have a temperature profile or characteristic where a loss (e.g., insertion loss) of the diode can vary inversely with temperature (e.g., an ambient temperature inside and/or surrounding the system 100). Therefore, the loss of a diode can increase as the ambient temperature decreases. As the loss of the forward biased diode decreases with an increase in temperature, more current may be allowed to pass through the forward biased diode. Further, the forward biased diode can be forward biased to different resistance levels by increasing or decreasing a bias voltage or bias current being applied to the forward biased diode.

In the example shown in FIG. 2A, the attenuator 130 can include an input terminal 230 configured to receive a control signal 232. The control signal 232 can be a bias voltage or a bias current that can forward bias the diodes 206 and 216 to various resistance levels. Thus, in addition to the loss of the diodes 206 and 216 varying inversely with ambient temperature, the control signal 232 can further adjust this varying loss of the diodes 206 and 216 to adjust and control the attenuation being performed by the attenuator 130. For example, if the control signal 232 is not supplied to the input terminal 230, the attenuation performed by the attenuator 130 can follow a temperature profile proportional to absolute temperature (PTAT) profile of the diodes 206 and 216, such as having less attenuation (the loss of the diodes are decreasing) as the ambient temperature increases. Note that the attenuation of the attenuator 130 decreases as the ambient temperature increases due to the diodes 206 and 216 allowing more current to pass through the channels of the attenuator 130 as their loss decreases, and as ambient temperature increases. Thus, as the ambient temperature decreases, less current may pass through the diodes 206 and 216, which increases the attenuation being applied by the attenuator 130.

In the example shown in FIG. 2A, the control signal 232 can decrease a bias voltage or bias current being applied to the diodes 206 and 216 in order to increase the attenuation (e.g. increase loss of the diodes to reduce current flow through the diodes) being applied by the attenuator 130. Further, the control signal 232 can increase a bias voltage or bias current being applied to the diodes 206 and 216 in order to decrease attenuation (e.g. increase resistance to reduce current flow through the diodes) being applied by the attenuator 130.

An increase in the attenuation being applied by the attenuator 130 can increase a loss of the beamformer 102, where this loss can offset a gain of the beamformer 102. Thus, the control signal 232 can control the attenuator 130 to adjust a loss in the beamformer 102, and control a gain variation of the beamformer 102. The control signal 232 can be used to increase or decrease the attenuation (which may already be varying in response to changes in ambient temperature) being applied on the beamformer 102 by the attenuator 130.

In an example, the attenuator 130 can be connected to a controller 200. The controller 200 can be, for example, a microcontroller or control logic configured to generate the control signal 232 and input the control signal 232 to the input terminal 230 of the attenuator 130. The controller 200 can receive signal or data representing a target gain variation. In an example shown in FIG. 2C, the controller 200 can receive input data indicating a target gain variation 242 of the beamformer 102. The target gain variation 242 can indicate a rate of change of the gain of the beamformer 102, such as $G_T/\Delta T$. The controller 200 can monitor the ambient temperature and a gain of the beamformer 102. The controller 200 can use the monitored gain and ambient temperature to determine a current or instantaneous gain variation 240, such as $\Delta G/\Delta T$, of the beamformer 102.

Figure 2C:
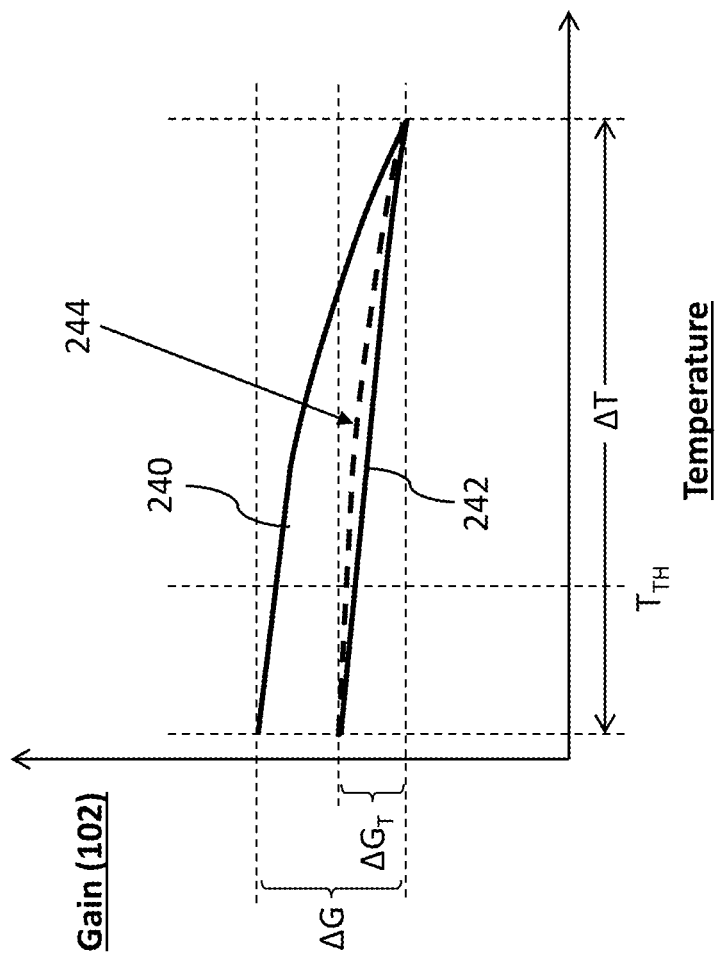
FIG. 2C is a diagram showing an example of a programmable temperature variable attenuator in one embodiment.

In the example shown in FIG. 2C, the gain variation $\Delta G$ is greater than the target gain variation $\Delta G_T$. The controller 200 can be configured or programmed to decrease the bias voltage or bias current being applied by the control signal 232 in order to increase the attenuation being applied by the attenuator 130 in response to the ambient temperature being below a specific temperature threshold $T_{TH}$. The increased attenuation at temperatures below $T_{TH}$ can lower the gain of the beamformer at temperatures below $T_{TH}$, and sometimes above $T_{TH}$. In an example, the temperature threshold $T_{TH}$ can be room temperature, such as approximately 20° C. to 27° C., such that low temperature can be referred to as temperatures lower than room temperature, and high temperatures can be referred to temperatures above room temperature. As a result of increasing the attenuation and decreasing the gain at temperatures below $T_{TH}$, a resulting gain variation 244 can be achieved. Note that the gain variation 244 may not be identical to the target gain variation 242. However, the control signal 232 can be adjustable based on the target gain variation 242, such that a gain variation matching, or being as close as possible, to the target gain variation, can be obtained. The controller 200 can continuously monitor the operations of the beamformer 102, and can be programmable, such that the attenuation of the attenuator 130 can be continuously refined to obtain a desired gain variation for the beamformer 102.

Figure 3A:
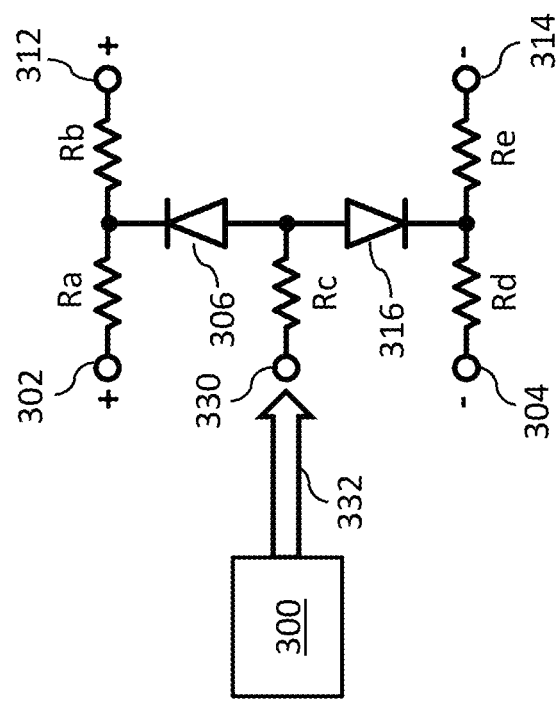
FIG. 3A is a diagram showing another example of a programmable temperature variable attenuator in one embodiment.

FIG. 3A is a diagram showing another example of a programmable temperature variable attenuator in one embodiment. In an example shown in FIG. 3, the attenuator 130 can include terminals or pins 302, 304, 312, and 314. The pins 302, 304, 312, and 314 can be input/output (I/O) terminals or pins of the attenuator 130. In the example shown in FIG. 3A, the attenuator 130 can implement differential signaling for connections using a pair of conductors (e.g., a pair of wires, a pair of twisted wires, etc.). The pins 302 and 312 can be positive terminals forming a positive channel of the attenuator 130 and the pins 304 and 314 can be negative terminals forming a negative channel of the attenuator 130. In another example shown in FIG. 3B, the attenuator 130 can also be an unbalanced attenuator implementing single-wire signaling for connections using single-wire transmission lines. It will be apparent to a person of ordinary skill in the art that the examples shown in FIG. 3A and FIG. 3B can function similarly, and the descriptions herein pertaining to FIG. 3A can be applicable to FIG. 3B, and vice versa.

Figure 3B:
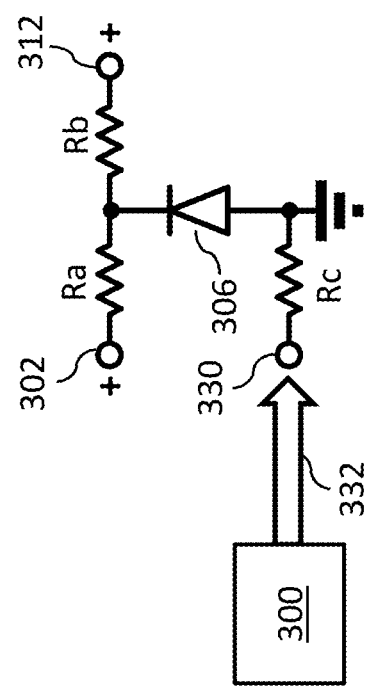
FIG. 3B is a diagram showing another example of a programmable temperature variable attenuator in one embodiment.

In the example shown in FIG. 3B, the pins 302, 304, 312, and 314 can be connected to different parts or components of the system 100 shown in FIG. 1. In the example shown in FIG. 1, the pins 302 and 304 of the attenuator 130 can be connected to the port 131 of the beamformer 102, and the pins 312 and 314 of the attenuator 130 can be connected to the node 120 in the beamformer 102. In another example, the pins 302 and 304 of the attenuator 130 can be connected to the node 120 of the beamformer 102, and the pins 312 and 314 of the attenuator 130 can be connected to the port 131 in the beamformer 102. In another example, if the attenuator 130 is located at the location 132, the pins 302 and 304 of the attenuator 130 can be connected to the circuit 104, and the pins 312 and 314 of the attenuator 130 can be connected to the port 131 of the beamformer 102. Further, in some examples, if the attenuator 130 is located at the location 132, the pins 302 and 304 of the attenuator 130 can be connected to the port 131 of the beamformer 102, and the pins 312 and 314 of the attenuator 130 can be connected to the circuit 104. The attenuator 130 can be implemented in both a transmitting direction and a receiving direction. For example, connections between the attenuator 130 and the beamformer, or between the attenuator 130 and the circuit 104, can be switched between a transmission mode and a receiving mode such that the attenuator 130 can perform attenuation for signals being transmitted and received by the beamformer 102.

The attenuator 130 can include a diode 306 and a diode 316. In an example, the diodes 306 and 316 can be PIN diodes. It will be apparent to a person of ordinary skill in the art that the diodes 206 and 216 can be any type of diodes, depending on designs, configurations, and/or implementations of the beamformer 102. The diodes 306 and 316 can be connected to one another in series and in opposing directions, such that an anode terminal of the diode 306 can be connected to an anode terminal of the diode 316. A cathode terminal of the diode 306 can be connected to the positive channel of the attenuator 130, and a cathode terminal of the diode 316 can be connected to the negative channel of the attenuator 130. One or more resistors Ra, Rb, Rc, Rd, Re, can be connected in series along the positive channel and the negative channel of the attenuator 130 to facilitate impedance matching and biasing of the diodes 306 and 316.

In the example shown in FIG. 3A, the attenuator 130 can include an input terminal 330 configured to receive a control signal 332. The control signal 332 can be a bias voltage or a bias current that can forward bias the diodes 306 and 316 to various resistance levels. Thus, in addition to the loss of the diodes 306 and 316 varying inversely with ambient temperature, the control signal 332 can further adjust this varying loss of the diodes 306 and 316 to adjust and control the attenuation being performed by the attenuator 130. For example, if the control signal 332 is not supplied to the input terminal 330, the attenuation performed by the attenuator 130 can oppose a temperature profile (e.g., a complementary to absolute temperature (CTAT) profile) of the diodes 306 and 316, such as having more attenuation (the loss of the diodes are decreasing) as the ambient temperature increases. Note that the attenuation of the attenuator 130 increases as the ambient temperature increases due to the diodes 306 and 316 allowing more current to pass through the channels of the attenuator 130 as their loss decreases, and as ambient temperature increases. The increase of current flowing though the diodes 306 and 316 decreases the current flowing through the positive channel and negative channels of the attenuator, thus increasing the attenuation. Therefore, as the ambient temperature decreases, more current may pass through the diodes 306 and 316, which increases the attenuation being applied by the attenuator 130.

In the example shown in FIG. 3A, the control signal 332 can increase a bias voltage or bias current being applied to the diodes 306 and 316 in order to decrease the attenuation (e.g. decrease loss of the diodes to allow more current to be redirected from the positive and negative channels of the attenuator 130 to the diodes) being applied by the attenuator 130. Further, the control signal 332 can decrease a bias voltage or bias current being applied to the diodes 306 and 316 in order to increase attenuation (e.g. increase loss of the diode to reduce current being redirected from the positive and negative channels of the attenuator 130 to the diodes) being applied by the attenuator 130.

An increase in the attenuation being applied by the attenuator 130 can increase a loss of the beamformer 102, where this loss can offset a gain of the beamformer 102. Thus, the control signal 332 can control the attenuator 130 to adjust a loss in the beamformer 102, and control a gain variation of the beamformer 102. The control signal 332 can be used to increase or decrease the attenuation (which may already be varying in response to changes in ambient temperature) being applied on the beamformer 102 by the attenuator 130.

In an example, the attenuator 130 can be connected to a controller 300. The controller 300 can be, for example, a microcontroller or control logic configured to generate the control signal 232 and input the control signal 232 to the input terminal 230 of the attenuator 130. The controller 300 can receive signal or data representing a target gain variation. Similar to the controller 200 shown in FIG. 2, the controller 300 can receive input data indicating the target gain variation 242 (shown in FIG. 2B) of the beamformer 102. The controller 300 can monitor the ambient temperature and a gain of the beamformer 102. The controller 300 can use the monitored gain and ambient temperature to determine the gain variation 240, such as $\Delta G/\Delta T$, of the beamformer 102. In response to the gain variation AG being greater than the target gain variation $\Delta G_T$. The controller 300 can be configured or programmed to increase the bias voltage or bias current being applied by the control signal 332 in order to increase the attenuation being applied by the attenuator 130 when the ambient temperature is below the temperature threshold $T_{TH}$.

The control signals 232 and 332 can provide additional refinement or adjustment to the varying loss of the diodes 206, 216 and diodes 305, 316, respectively, in order to adjust the attenuation being applied by the attenuator 130. The control signals 232 and 332 can provide arbitrary values or amounts of bias voltage or bias current to the diodes 206, 216, 306, and 316, which can be advantageous when compared to some variable attenuators that may utilize discrete and preset levels (that are fixed and cannot be changed) of control voltages during operation. Further, using the control signals 232 and 332 to adjust the varying loss of the attenuator 130 can be advantageous when compared to attenuators that may used additional components, such as thermistors, to aid temperature compensation as these additional components can occupy circuit board space and their temperature coefficients are set and cannot be changed after being selected for integration. Thus, the attenuator 130 described herein can have a small size (e.g., use up less board area), can consume less power, and can be bi-directional (e.g., used in both receiving and transmission configurations), and can further refine the varying attenuation that is already being applied to the beamformer 102.

Figure 4:
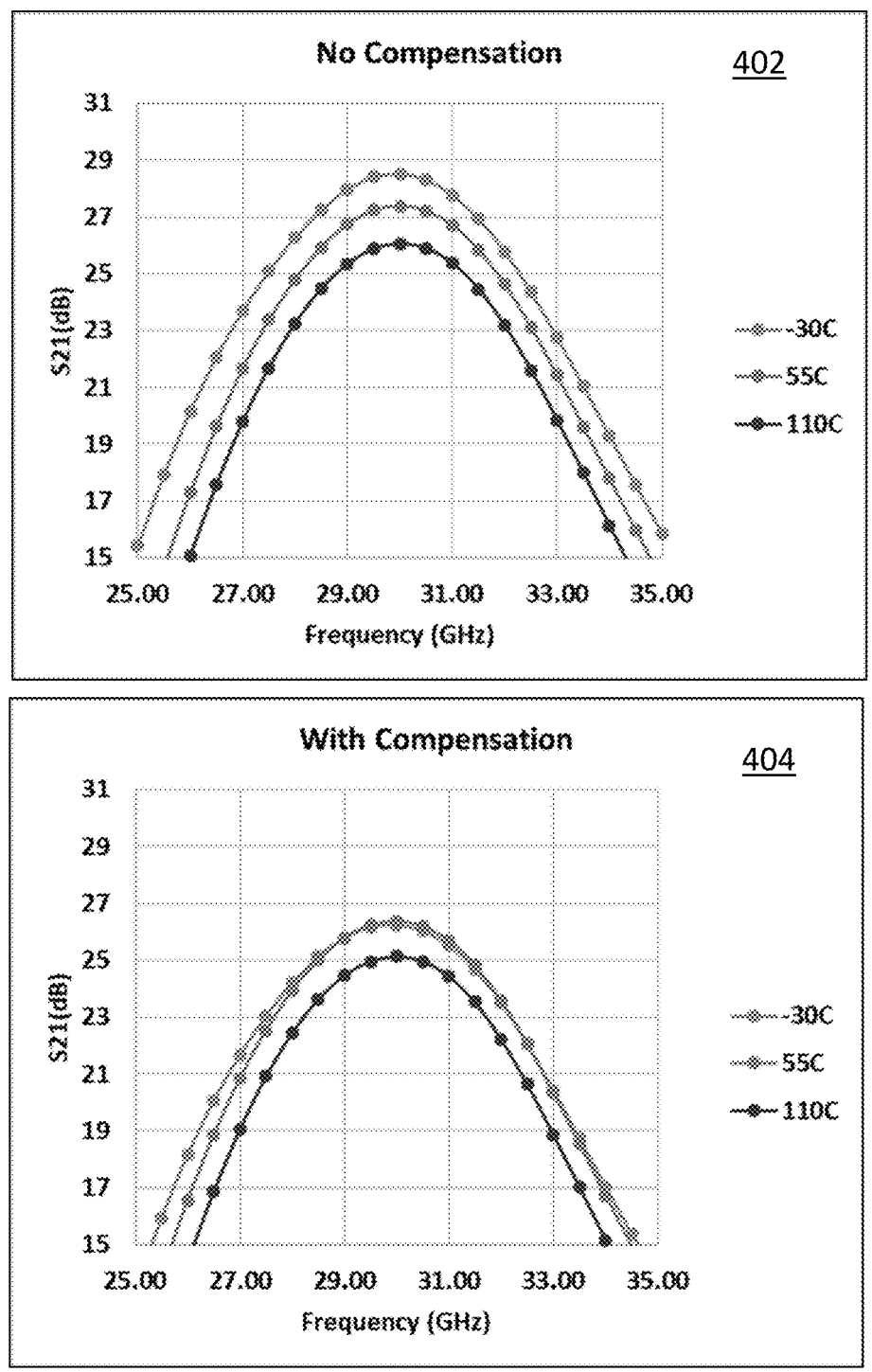
FIG. 4 is a diagram showing an example simulation result of an implementation of gain variation compensation using temperature attenuator in one embodiment.

FIG. 4 is a diagram showing an example simulation result of an implementation of a gain variation compensation using temperature attenuator in one embodiment. In the examples shown in FIG. 4, a simulation 402 is a simulation of a gain of the beamformer 102 when the attenuator 130 is not integrated in the system 100 or not activated. A simulation 404 is a simulation of a gain of the beamformer 102 when the attenuator 130 is integrated in the system 100 or is activated. In the simulation 402, the gain of the beamformer 102 decreased approximately 2.5 decibels (dB) when an ambient temperature increased from −30° C. to 110° C. In the simulation 404, the gain of the beamformer 102 decreased approximately 1.0 dB when an ambient temperature increased from −30° C. to 110° C. Thus, the integration of the attenuator 130 can decrease the gain variation of the beamformer 102 in response to temperature changes.

FIG. 5 is a flow diagram illustrating a process of implementing gain variation compensation using temperature attenuator in one embodiment. The process can include one or more operations, actions, or functions as illustrated by one or more of blocks 502, 504, and/or 506. Although illustrated as discrete blocks, various blocks can be divided into additional blocks, combined into fewer blocks, eliminated, or performed in parallel, depending on the desired implementation.

The process 500 can begin at block 502. At block 502, an attenuator of an apparatus can perform attenuation of signals for an integrated circuit. The process 500 can proceed from block 502 to block 504. At block 504, the attenuator can vary the attenuation with an ambient temperature. The process 500 can proceed from block 504 to block 506. At block 506, the attenuator can adjust the attenuation based on a control signal applied to the attenuator.

In an example, a controller of the apparatus, or a controller connected to the apparatus, can receive a target gain variation of the integrated circuit. The controller can determine a gain variation of the integrated circuit. The controller can generate the control signal to adjust the attenuation applied to the integrated circuit in order to adjust the determined gain variation to match the target gain variation. In an example, the control signal can be one of a bias voltage for at least one PIN diode integrated in the attenuator and a bias current for the at least one PIN diode integrated in the attenuator.

In an example, at least one diode of the attenuator can apply the attenuation, where the at least one diode can be connected in series with a current path of the attenuator. The at least one diode can vary the attenuation inversely with the ambient temperature. The controller can decrease a bias, represented by the control signal, of the at least one diode to increase the attenuation.

In an example, at least one diode of the attenuator can apply the attenuation, where the at least one diode can include a cathode terminal connected to a current path of the attenuator and an anode terminal connected to an input terminal configured to receive the control signal. The at least one diode can vary the attenuation proportionally with the ambient temperature. The controller can increase a bias, represented by the control signal, of the at least one diode to increase the attenuation.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
    an attenuator including an analog component, the attenuator being configured to:
        perform attenuation of incoming and outgoing signals for an integrated circuit, wherein the incoming and output signals are processed by a plurality of communication channels of the integrated circuit, and the attenuator is located outside of the plurality of communication channels;
        receive a control signal that depends on a temperature profile of the analog component in the attenuator and depends on a target gain variation of the integrated circuit, wherein the temperature profile is one of a proportional to absolute temperature (PTAT) profile and a complementary to absolute temperature (CTAT) profile that defines changes in a characteristic of the analog component with changes in an ambient temperature, the target gain variation is a minimal rate of change of a gain of the integrated circuit; and
        apply the control signal to bias the analog component to adjust the attenuation of the incoming and outgoing signals of the integrated circuit to decrease a current gain variation of the integrated circuit to reach the target gain variation.

2. The apparatus of claim 1, wherein the attenuator comprises at least one analog component that includes the analog component, the at least one analog component includes at least one diode, and the control signal is one of:
    a bias voltage for the at least one diode of the attenuator; and
    a bias current for the at least one diode of the attenuator.

3. The apparatus of claim 1, wherein the attenuator is integrated in the integrated circuit.

4. The apparatus of claim 1, wherein the integrated circuit is a beamformer.

5. The apparatus of claim 1, wherein the attenuator is located at a common connection point among the plurality of communication channels.

6. The apparatus of claim 1,
    wherein the attenuator comprises at least one analog component that includes the analog component, and the at least one analog component includes at least one diode, and
    wherein:
        the at least one diode is connected in series with a current path of the attenuator; and
        the attenuation is increased by a decrease of bias being applied by the control signal to bias the analog component.

7. The apparatus of claim 1,
    wherein the attenuator comprises at least one analog component that includes the analog component, and the at least one analog component includes at least one diode, and
    wherein:
        the at least one diode comprising a cathode terminal connected to a current path of the attenuator and an anode terminal connected to an input terminal configured to receive the control signal, and
        the attenuation is increased by an increase of bias being applied by the control signal to bias the analog component.

8. The apparatus of claim 1, further comprising:
    a communication device; and
    a beamformer, as the integrated circuit, connected to the communication device.

9. The apparatus of claim 8, wherein the attenuator is connected between the beamformer and the communication device.

10. The apparatus of claim 1, further comprising:
    a controller configured to:
        receive the target gain variation of the integrated circuit;
        determine a current gain variation of the integrated circuit; and
        generate the control signal based on the target gain variation and the current gain variation.

11. A method comprising:
    performing, by an attenuator, attenuation of incoming and outgoing signals for an integrated circuit, wherein the incoming and output signals are processed by a plurality of communication channels of the integrated circuit, and the attenuator is located outside of the plurality of communication channels;
    receiving, by the attenuator, a control signal that depends on a temperature profile of an analog component in the attenuator and depends on a target gain variation of the integrated circuit, wherein the temperature profile is one of a proportional to absolute temperature (PTAT) profile and a complementary to absolute temperature (CTAT) profile that defines changes in a characteristic of the analog component with changes in an ambient temperature, and the target gain variation is a minimal rate of change of a gain of the integrated circuit; and
    applying, by the attenuator, the control signal to bias the analog component to adjust the attenuation of the incoming and outgoing signals of the integrated circuit to decrease a current gain variation of the integrated circuit to reach the target gain variation.

12. The method of claim 11, further comprising:
    receiving, by a controller, a target gain variation of the integrated circuit;
    determining, by the controller, a current gain variation of the integrated circuit; and generating, by the controller, the control signal based on the target gain variation and the current gain variation.

13. The method of claim 11, wherein the attenuator comprises at least one analog component that includes the analog component, the at least one analog component includes at least one diode, and the method further comprising generating the control signal as one of:
a bias voltage for at least one diode integrated in the attenuator; and
a bias current for the at least one diode integrated in the attenuator.

14. The method of claim 11, wherein the attenuator comprises at least one analog component that includes the analog component, the at least one analog component includes at least one diode connected in series with a current path of the attenuator, and the method further comprising:
decreasing the bias being applied to the at least one diode by the control signal to increase the attenuation.

15. The method of claim 11, wherein the attenuator comprises at least one analog component that includes the analog component, the at least one analog component includes at least one diode comprising a cathode terminal connected to a current path of the attenuator and an anode terminal connected to an input terminal configured to receive the control signal, and the method further comprising:
increasing the bias being applied to the at least one diode by the control signal to increase the attenuation.

16. An apparatus comprising:
a controller configured to:
receive a target gain variation of an integrated circuit comprising a plurality of communication channels that process incoming and outgoing signals of the integrated circuit, wherein the target gain variation is a minimal rate of change of a gain of the integrated circuit;
determine a gain variation of the integrated circuit; and
generate a control signal to bias an analog component in an attenuator located outside of the plurality of communication channels, wherein the control signal depends on a temperature profile of the analog component and depends on the target gain variation of the integrated circuit, the temperature profile is one of a proportional to absolute temperature (PTAT) profile and a complementary to absolute temperature (CTAT) profile that defines a changes in a characteristic of the analog component with an ambient temperature, bias of the analog component changes the characteristic of the analog component and changes to the characteristic adjusts an attenuation of the incoming and outgoing signals of the integrated circuit to decrease the determined gain variation of the integrated circuit to match the target gain variation.

17. The apparatus of claim 16, wherein the controller is configured to generate the control signal using the target gain variation of the integrated circuit.

18. The apparatus of claim 16, wherein the attenuator comprises at least one analog component that includes the analog component, and the at least one analog component includes at least one diode, and the control signal is one of:
a bias voltage for the at least one diode of the attenuator; and
a bias current for the at least one diode of the attenuator.

19. The apparatus of claim 16, wherein the integrated circuit is a beamformer, and the attenuator is located at a common connection point among the plurality of communication channels.

20. The apparatus of claim 1, wherein:
the temperature profile is the PTAT profile when the analog component is connected in series with a current path of the attenuator; and
the temperature profile is the CTAT profile when a cathode terminal of the analog component is connected to the current path of the attenuator.

* * * * *